(12) United States Patent
Veitsel et al.

(10) Patent No.: US 12,105,125 B2
(45) Date of Patent: Oct. 1, 2024

(54) DIGITAL RECONFIGURABLE APPARATUS FOR SPECTRUM ANALYSIS AND INTREFERENCE REJECTION

(71) Applicant: Topcon Positioning Systems, Inc., Livermore, CA (US)

(72) Inventors: Andrey V. Veitsel, Moscow (RU); Pavel V. Kalmykov, Moscow (RU); Igor A. Orlovsky, Moscow (RU); Victor A. Prasolov, Moscow (RU); Evgeny N. Sidorov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 43 days.

(21) Appl. No.: 16/757,639

(22) PCT Filed: Aug. 13, 2019

(86) PCT No.: PCT/RU2019/000572
§ 371 (c)(1),
(2) Date: Feb. 18, 2022

(87) PCT Pub. No.: WO2021/029779
PCT Pub. Date: Feb. 18, 2021

(65) Prior Publication Data
US 2024/0085570 A1    Mar. 14, 2024

(51) Int. Cl.
*G01R 23/167* (2006.01)
*H04K 3/00* (2006.01)

(52) U.S. Cl.
CPC ............ *G01R 23/167* (2013.01); *H04K 3/90* (2013.01)

(58) Field of Classification Search
CPC .................... G01R 23/16–167; H04K 3/80–94
See application file for complete search history.

(56) References Cited

U.S. PATENT DOCUMENTS 4,613,978 A * 9/1986 Kurth ....................... H04B 1/69
455/308
6,219,376 B1 4/2001 Zhodzishsky et al.
(Continued)

FOREIGN PATENT DOCUMENTS

JP    2005260860 A * 9/2005 ........... H04B 1/1036
RU    2513028 C2   4/2014
WO    WO-02093807 A1 * 11/2002 ............. H04B 1/123

OTHER PUBLICATIONS

Search Report in PCT/RU2019/000572, dated Aug. 29, 2020.

*Primary Examiner* — Gennadiy Tsvey
(74) *Attorney, Agent, or Firm* — Bardmesser Law Group (57) ABSTRACT

Digital anti-jam apparatus includes a CPU; N spectrum analysis and band rejection (SABR) modules, each receiving a digital quadrature signal input, outputting a spectral data output, and outputting a quadrature output with interference band rejected; the CPU first places the SABR modules into a spectral analysis (SA) mode, and upon detection of interference, places the SABR modules into a band rejection (BR) mode while the interference continues; N N-to-1 multiplexers, whose quadrature outputs are connected to corresponding SABR modules, wherein the CPU controls whether to connect an input of each multiplexer either to the quadrature signal input or to the quadrature band-reject output of any other SABR module; a (N+1)-to-1 multiplexer, connected to the quadrature signal input or to the quadrature output of any SABR module; and a frequency conversion module, that receives output of the (N+1)-to-1 multiplexer and shifts a spectrum of the digital quadrature signal input.

15 Claims, 9 Drawing Sheets

(56) References Cited

U.S. PATENT DOCUMENTS

| | | | |
|---|---|---|---|
| 6,807,405 B1 | 10/2004 | Jagger et al. | |
| 7,876,869 B1* | 1/2011 | Gupta | H04B 1/109 455/150.1 |
| 8,614,940 B1* | 12/2013 | Dybdal | H04J 11/0066 370/542 |
| 2001/0050949 A1* | 12/2001 | Popeck | H04B 1/71075 375/E1.031 |
| 2002/0061080 A1* | 5/2002 | Richards | H04B 1/719 375/346 |
| 2006/0008017 A1* | 1/2006 | Balakrishnan | H04L 27/2613 375/260 |
| 2010/0026547 A1 | 2/2010 | Weissman et al. | |
| 2012/0026039 A1* | 2/2012 | Ganeshan | G01S 19/37 342/357.73 |
| 2012/0147929 A1* | 6/2012 | Malaga | H04B 1/0014 375/147 |
| 2014/0169501 A1* | 6/2014 | Nazarathy | H03H 21/0012 375/316 |
| 2015/0244416 A1* | 8/2015 | Veitsel | H04B 1/109 375/148 |
| 2016/0322996 A1* | 11/2016 | Jabbour | H03H 19/008 |
| 2017/0280464 A1* | 9/2017 | Jagger | H04B 1/7103 |
| 2018/0358992 A1* | 12/2018 | Fernando | H04B 1/0057 |

* cited by examiner

DIGITAL RECONFIGURABLE APPARATUS FOR SPECTRUM ANALYSIS AND INTREFERENCE REJECTION

BACKGROUND OF THE INVENTION

Field of the Invention

The present invention relates to GNSS (global navigation satellite system) receivers, and, more particularly, to anti-jam technology for same. In general, the present invention relates to receivers working with wideband signals (i.e. tens or hundreds of MHz) with relatively narrow-band interference. The interference can be considered relatively narrow-band if its bandwidth is two or more times smaller than the band of the useful signal. For example, the bandwidth of the main lobe of the GPS C/A signal is 2 MHz. Interference with a band of 1 MHz or less, which falls in the main lobe, can be considered narrow-band and can be reduced, although some of the energy of the useful signal is lost (the notch band is matched to the interference band). The bandwidth of the main lobe of the GLONASS C/A signal is about 1 MHz. It is useless to cut the interference with the 1 MHz band that falls into the center of the main lobe, since the energy of the useful signal will be almost completely lost. This interference to the GLONASS C/A signal therefore cannot be considered narrowband. The bandwidth of the main lobe of the GPS P-signal is about 20 MHz. Interference with a 1 MHz band, which falls in the center of the main lobe, is relatively narrow-band and can be reduced without significant loss of energy of the useful signal. The bandwidth of the main lobe of the GLONASS P-signal is about 10 MHz. Interference with a 1 MHz band, which falls in the center of the main lobe, is also relatively narrow-band and can be cut without significant loss of energy of the useful signal.

Background of the Related Art

U.S. Pat. No. 8,913,652 B2, entitled "Method, system, and apparatus for wideband signal processing", describes embodiments capable of dynamically and adaptively operating on wideband signals. Examples include state variable filters whose center frequencies can be tuned using variable gain blocks coupled to outputs of filter integrators. First- and second-order state variable filters may operate on signals in parallel and their outputs combined to produce a filtered output. Filters may be tuned to pass or reject signals depending on the application; sample applications include spectrum analysis, interference detection and rejection.

U.S. Pat. No. 6,477,196 B1, entitled "Direct sequence spread spectrum communications receiver and method for efficient narrow-band signal excision", describes a method of excising one or more narrow-band interfering signals in a direct sequence spread spectrum receiver that performs a magnitude spectral analysis on baseband signals in a detection channel to determine which frequency bins in the spectral analysis output contain the interfering narrow-band signals by comparing the magnitude of the signals in the frequency bins to a threshold. The corrupted frequency bins are determined by the signal magnitudes exceeding the threshold and band rejection filters excise the narrow-band signals in the signal channel in accordance with the corrupted frequency bins.

EP U.S. Pat. No. 987,829 A, entitled "Method and apparatus for excision of narrow band interference signal from CDMA signal", describes a narrow band interference excision circuit for use in broadband digital data communication systems. The excision circuit is comprised of a matrix of polyphase filters that divide the input signal into a plurality of narrow sub-bands. Each narrow sub-band signal is examined to determine if narrowband interference exists in that bin. This is done preferably by taking the average of the absolute amplitude of the signals in the bin. If a signal in a bin has an absolute amplitude that far exceeds the average in the bin, the entire bin signal is eliminated.

U.S. Pat. No. 6,807,405 B1, entitled "Method and a device for maintaining the performance quality of a code-division multiple access system in the presence of narrow band interference", describes a method and device which dynamically detects, tracks and filters interfering signals with sufficient speed and fidelity to eliminate or greatly reduce the deleterious effects of narrow band interferer signals. When inserted in an RF signal path, an Adaptive Notch Filter (ANF) detects narrow band interferences above a threshold level. Detection is accomplished by continuous scanning of a preset band. Detected interferences are then suppressed.

U.S. Pat. No. 6,219,376 B1, entitled "Apparatuses and methods of suppressing a narrow-band interference with a compensator and adjustment loops", describes a method of suppression of narrow-band interferences attending at the receiver input added to the useful broadband signal and noise. There is a disclosed compensator rejecting narrow-band interferences by means of adjustment loops. Two general methods of construction of such loops are considered. The first general method is based on filtration of the in-phase and quadrature components of the error vector—the difference of the interference vector and compensating vector. The second method is based on filtration of the amplitude and full phase of the interference signal. Automatic tuning of the compensator to the mean frequency and effective interference band is ensured.

Unlike conventional solutions, the proposed fully digital reconfigurable anti-jam apparatus for spectrum analysis and narrow-band interference suppression allows more flexibility to allocate resources between spectral analysis and interference rejection and thereby speed up the detection of interference and suppress it effectively. For example, for GNSS signals the cut band for relatively narrow-band interference can be up to 1 MHz or more. Proposed solutions allow to implement the device without multiplying operations.

SUMMARY OF THE INVENTION

The present invention is directed to a GNSS anti-jam system and method that substantially obviates one or several of the disadvantages of the related art.

In some cases, the wideband signals of navigation and communication systems are affected by narrowband interferences. To combat such interferences, they need to be detected as soon as possible. For this purpose, the spectral analysis (SA) mode allows using all resources to detect interference in any part of the frequency range of interest and determine its frequencies. Then if necessary, all resources of the apparatus can be directed to rejection of any portions of the frequency spectrum of the input signal. In some cases, part of the apparatus resources can be used in the spectral analysis mode, and some, in the band rejection mode. The apparatus of the invention is located functionally between the quadrature output of a digital front end (DFE) of the receiver and the navigation channels.

The present invention relates to a fully digital reconfigurable apparatus for narrow-band interference suppression, whose quadrature input is connected to the quadrature output of a digital front end (DFE) of the receiver. The apparatus includes:

- a central processing unit (CPU),
- N identical dual mode modules (for convenience, typically 2<N<10) for spectrum analysis and band rejection (SABR) with quadrature signal input, control input from the CPU, quadrature band-reject output and the spectral data output, connected through the interface with the CPU; where the CPU controls the block parameters and operation mode-either the spectral analysis (SA) mode or the band rejection (BR) mode;
- N identical N-to-1 multiplexers, whose quadrature outputs are connected to the quadrature signal inputs of the corresponding SABR modules; these multiplexers have a control input from the CPU, through which they can be connected to the quadrature input of the apparatus or to the quadrature band-reject output of any other SABR module;
- an (N+1)-to-1 multiplexer, having a control input from the CPU, through which it can be connected to the quadrature input of the apparatus or to the quadrature band-reject output of any other SABR module;
- a frequency converter with phase correction (FCPC), whose quadrature input is connected to the output of the (N+1)-to-1 multiplexer and whose quadrature output is the output of the apparatus; wherein the CPU controls the frequency of conversion.

The proposed method of narrow-band interference suppression is used in a receiver that receives a broadband signal. The anti-jam (AJ) apparatus is located between a digital front end (DFE) and a digital signal processing (DSP) blocks of receiver, wherein the AJ apparatus processes sampled and quantized samples from the DFE output and contains:

- N identical dual mode adjustable modules (for convenience, typically 2<N<10) designed to spectrum analysis and band rejection (SABR),
- a number of multiplexers with which the AJ apparatus is configured so that:
  a) all N SABR-modules can be used for spectral analysis in any part of spectrum at the DFE output, or
  b) all N SABR-modules connected in series can be used for successive band rejection in any part of spectrum at the DFE output, or
  c) B SABR-modules (B<N; for example, N=7, B=4) can be used for successive band rejection in any part of spectrum at the DFE output and the remaining (N−B=3) modules can be used for spectral analysis in any part of spectrum at the DFE output and/or at band rejection outputs of SABR-modules;
  d) a frequency converter with phase correction (FCPC) that is located at the output of the anti-jam (AJ) apparatus and is designed to return the spectrum, shifted during band rejection, to its original position.

In another embodiment, a digital anti-jam (AJ) apparatus, the AJ apparatus includes a central processing unit (CPU); N spectrum analysis and band rejection (SABR) modules (N>2), each SABR module receiving a digital quadrature signal input, outputting a spectral data output to the CPU, and also outputting a quadrature output with interference band rejected, wherein the CPU controls the SABR modules to first place the SABR modules into a spectral analysis (SA) mode, and upon detection of interference, then to place at least one of the SABR modules into a band rejection (BR) mode while the interference continues; N N-to-1 multiplexers, whose quadrature outputs are connected to the quadrature signal inputs of the corresponding SABR modules, wherein the CPU controls whether to connect an input of each multiplexer either to the quadrature signal input or to the quadrature band-reject output of any other SABR module; a (N+1)-to-1 multiplexer controlled by the CPU, through which it can be connected to the quadrature signal input or to the quadrature output of any SABR module; and a frequency conversion (FC) module, that receives a quadrature output of the (N+1)-to-1 multiplexer and whose output is a filtered output of the AJ apparatus, wherein the FC module shifts a spectrum of the digital quadrature signal input up or down.

Additional features and advantages of the invention will be set forth in the description that follows, and will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
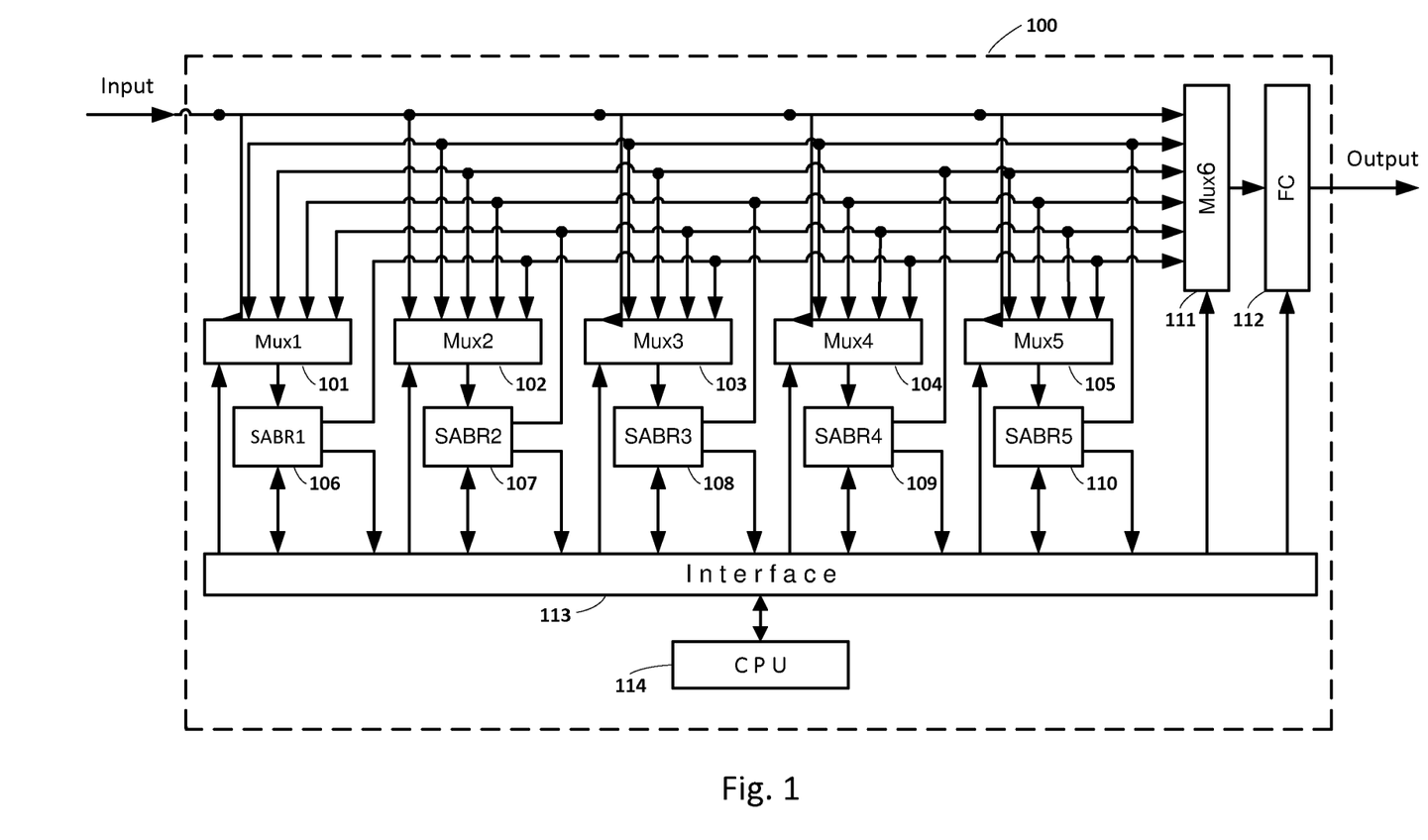
FIG. 1 is a block diagram of an embodiment of the invention.

FIG. 1 shows a block diagram of a fully digital reconfigurable anti-jam (AJ) apparatus (100) for spectrum analysis and narrow-band interference suppression, whose digitized quadrature input is connected to the quadrature output of a digital front end (DFE) of a receiver and receives samples of a wideband signal. For example, for GNSS signals the sampling frequency can be up to 200 MHz or more. The anti-jam apparatus includes:

a central processing unit (CPU) (114), five (N=5) identical dual mode modules (106)-(110) for spectrum analysis and band rejection (SABR) with quadrature signal input, quadrature band-reject output and the spectral data output, connected through the interface (113) to the CPU; where the CPU controls the SABR modules parameters and operation mode-either the spectral analysis (SA) mode or the band rejection (BR) mode; the interface 113 may be a set of keys and registers, each of which has an address that the CPU uses to control the other components;

five identical 5-to-1 multiplexers (101)-(105), whose quadrature output are connected to the quadrature signal inputs of the corresponding SABR modules; these multiplexers have a control input from the CPU, through which they can be connected to the quadrature input of the AJ apparatus or to the quadrature band-reject output of any other SABR module;

a 6-to-1 multiplexer (111), having a control input from the CPU, through which it can be connected to the quadrature input of the AJ apparatus (100) or to the quadrature band-reject output of any other SABR module;

a frequency converter (FC) (112), whose quadrature input is connected to the output of the 6-to-1 multiplexer and whose quadrature output is the output of the apparatus; where the CPU controls the conversion frequency so as to return the spectrum, shifted during band rejection, to its original position.

Five of multiplexers can be configured by the CPU so that:
a) all five SABR-modules can be used for spectral analysis in any part of spectrum at the DFE output, or
b) all five SABR-modules connected in any order in series can be used for successive band rejection in any part of spectrum at the DFE output, or
c) B SABR-modules (B<N, i.e., B<5, for example, B=3) can be used for successive band rejection in any part of spectrum at the DFE output and the remaining (N−B=5−3=2) modules can be used for spectral analysis in any part of spectrum at the DFE output and/or at band rejection outputs of SABR-modules.

Conversion frequency of the FC converter (112) depends on the values of the reference frequencies of the modules involved in the successive interference rejection.

Example: The spectral analysis detected four interference at frequencies $f_1$, $f_2$, $f_3$ and $f_4$, which correspond to the numbers of the reference frequencies $n_1$, $n_2$, $n_3$ and $n_4$. These interferences are successively cut out by blocks by shifting to zero frequency and high-frequency filtering (i.e. by zero-centered notch filters) of the shifted process. Then for the reference frequency of the 1st block the number $m_1=m_1$ is set, for the 2nd block—the number $m_2=n_2-n_1$, for the 3rd block—the number $m_3=n_3-n_2$, for the 4th block—the number $m_4=n_4-n_3$. As a result, the total shift of the input spectrum will be $$m_\Sigma=m_1+m_2+m_3+m_4=n_1+(n_2-n_1)+(n_3-n_2)+(n_4-n_3)=n_4.$$

Thus, to return the spectrum to its original position, it is necessary to set the value $m_C=-m_\Sigma=-n_4$ for the reference frequency of the up-down frequency converter (FC) (112). That is, the number of $m_C$ is equal to the number of the latest cut-out interference, taken with the opposite sign.

Figure 2:
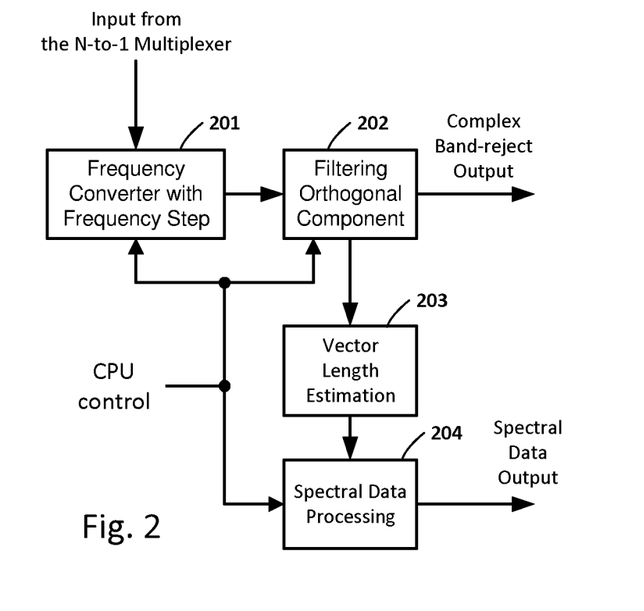
FIG. 2 is a block diagram of a module for spectrum analysis and band rejection (SABR).

FIG. 2 shows a block diagram of module for a spectrum analysis and band rejection (SABR) that includes:
(i) a frequency converter with frequency step (FCFS) (201) whose quadrature input is the SABR module input; where the reference frequency of the FCFS is constant in the band rejection (BR) mode and set by the CPU control; in the spectral analysis (SA) mode the reference frequency of the FCFS can be tuned in the adjusted range with the adjusted frequency step at the adjusted frequency of change by the CPU control;

(ii) a module for filtering orthogonal components (FOC) (202) on the FCFS output; where, in the BR mode, high-pass filtering with an adjustable bandwidth by the CPU control is performed, and goes to first complex FOC module output which is the band-reject output of the SABR module; at the same time high-pass filtering weakens those frequencies that have a smaller interference bandwidth (for example, with an interference bandwidth of 10 kHz, the notch band is set to 10 kHz and then frequencies lower than 10 KHz are attenuated); also in the spectral analysis mode the input process passes through low-pass filtering with an adjustable bandwidth by the CPU control and goes to second complex FOC module output as spectral samples corresponding to the reference frequencies of the FCFS; at the same time low-pass filtering allows you to set the desired filter band for spectral analysis; while the smaller the low-pass filter band, the higher the accuracy of determining the interference frequency, for example, for the low-pass filter band 100 Hz the accuracy of determining the interference frequency will be about 100 Hz;

(iii) a unit (203) for vector length estimation (VLE) whose the complex input connects to the second complex spectral output of the HLPF (202) module; wherein the vector length is estimated as a function of the magnitude of the input quadrature components and is the spectral estimate corresponding to the current reference frequency of the FCFS (201);

(iv) a unit for spectral data processing (SDP) (204) whose input connects to the output of the VLE unit; wherein the SPD unit processes the spectral data in accordance with a certain algorithm and results of spectral processing are stored in the internal memory of the SDP unit and can be read into the CPU at the end of the SA mode through the spectral data output of the SABR module.

Figure 3:
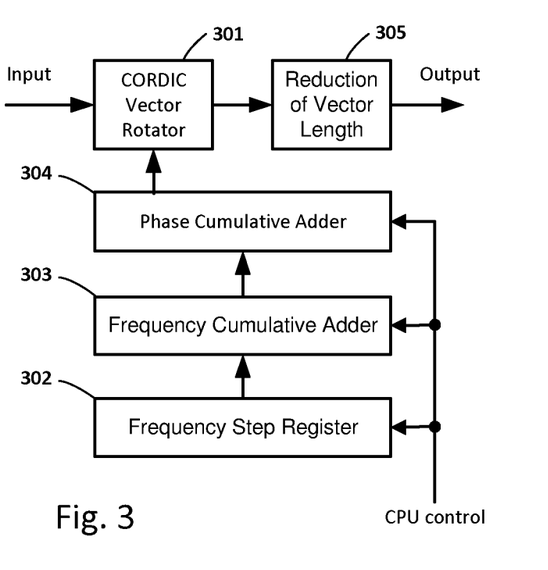
FIG. 3 is a block diagram of a module of frequency conversion with frequency step (FCFS).

FIG. 3 shows a block diagram for the tunable frequency converter with frequency step (FCFS) that includes:
a) a CORDIC vector rotator (CVR) (301) that rotates an input vector in a plane, based on a shift-add structure CORDIC algorithm for integers (see Volder, Jack E., "The CORDIC Trigonometric Computing Technique", IRE Transactions on Electronic Computers, Volume EC-8, 330-334, September 1959, incorporated herein by reference in its entirety);
b) a frequency step (FS) register (302) storing a step number of reference frequency change;
c) a frequency cumulative adder (FCA) (303), that accumulates with frequency $f_{FCA}=f_s/N_{FCA}$ the frequency step numbers from the FS register; here $f_s$ is a sampling frequency, $N_{FCA} \geq 1$ is an integer set by the CPU;
d) a phase cumulative adder (PCA) (304), that accumulates at a sampling frequency $f_s$ the reference frequency number stored in the FCA; wherein an output of the PCA is provided to the CVR reference;
e) a block (305) for reduction of vector length (RVL) by reducing the magnitude of its orthogonal components.

The FOC module contains two identical dual mode modules for separate high and low pass filtering (HLPF) of orthogonal components of the input complex process of the FOC module.

Figure 4:
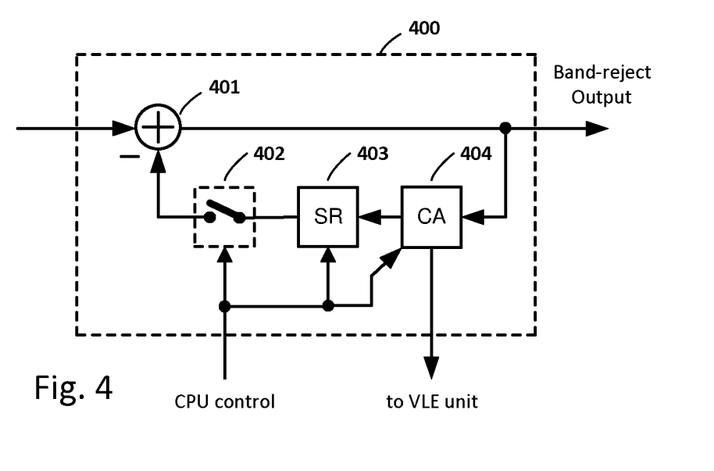
FIG. 4 is a block diagram of a high and low pass filtering (HLPF) module.

FIG. 4 shows a block diagram of module 400 for the high and low pass filtering (HLPF) of orthogonal components (real or quadrature) of the input complex process of the FOC module; where the HLPF module includes:

a) a subtractor (401), whose first input is connected to an input of the HLPF unit and output is connected to an output of the HLPF module, b) a CPU controlled switch (402) that is open in the SA mode and closed in the BR mode, c) an adjustable shift register (403), whose output is connected to second input of the subtractor, d) a cumulative adder with reset (CAWR) (404), that accumulates the number M of samples; where CAWR input is connected to the subtractor output and CAWR output is connected to input of the shift register via the switch; where this accumulation is consistent with the change in the reference frequency of the converter.

The CAWR is the zero-centered low-pass filter with the frequency response $S_{LP}(x, M)$:

$$S_{LP}(x,M) = a\ \text{sin}\ c(x,M) = \sin(\pi M x)/\sin(\pi x),\ \text{where}\ x = f/f_s; M = \text{const.} \quad (1)$$

The a sin c (x, M) function is called aliased sin c(x) function; FIG. 7B shows the normalized amplitude-frequency characteristic of the CAWR: $1/M^*|S_{LP}(x, M)|$, where M=20.

Figure 8:
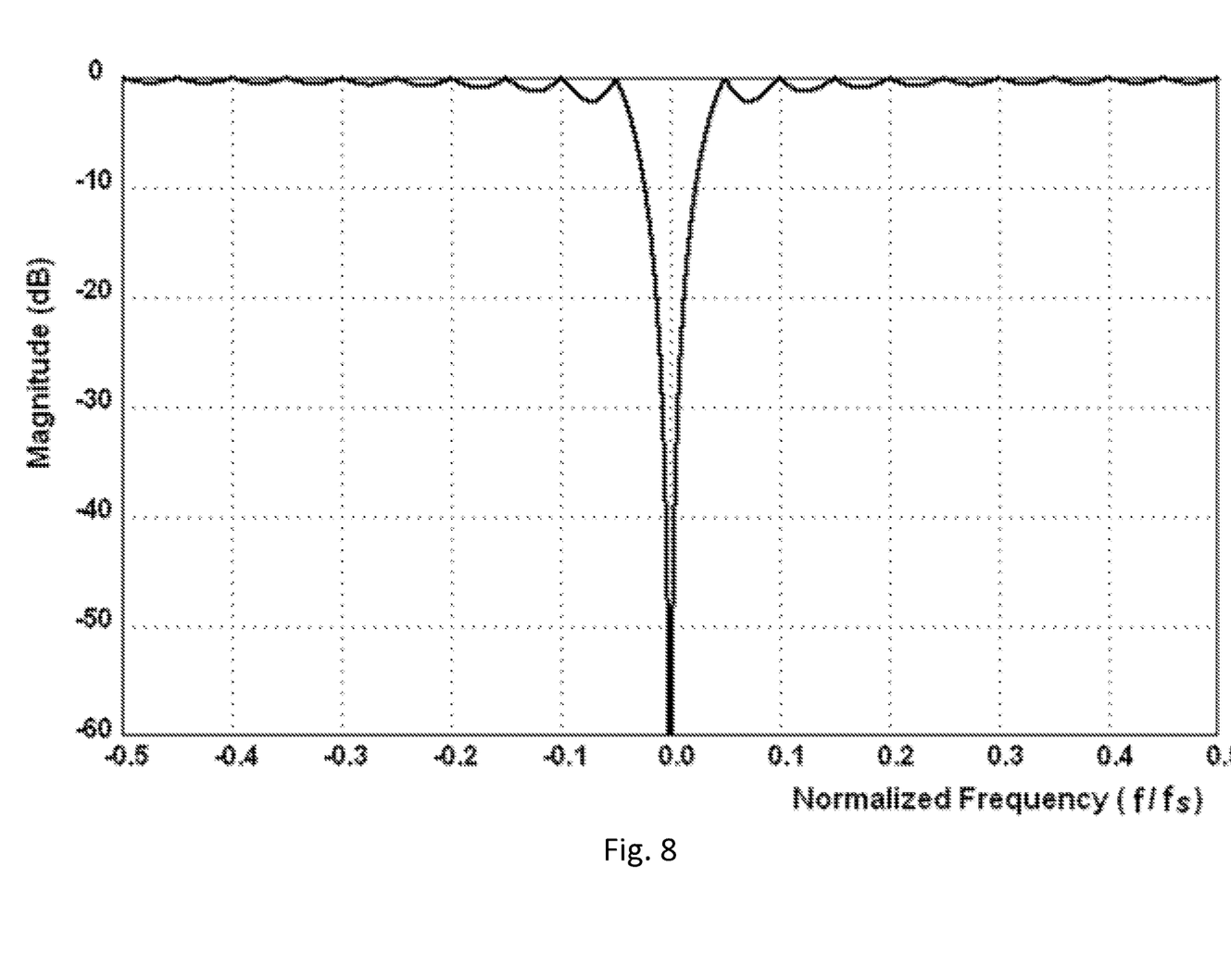
FIG. 8 shows a normalized frequency response of a zero-centered notch filter.

In the BR mode, when the switch (402) is closed, the HLPF module is the high-pass filter (for the band rejection output) or zero-centered notch filter, whose frequency response is shown in FIG. 8. The low-pass filtering bandwidth as well as notch bandwidth is inversely proportional to the number M of accumulated samples. For example, if the sampling frequency $f_s$=100 MHz and the accumulated samples are M=100,000, the low-pass filter (and high-pass filter) will be 1 kHz.

Figure 5:
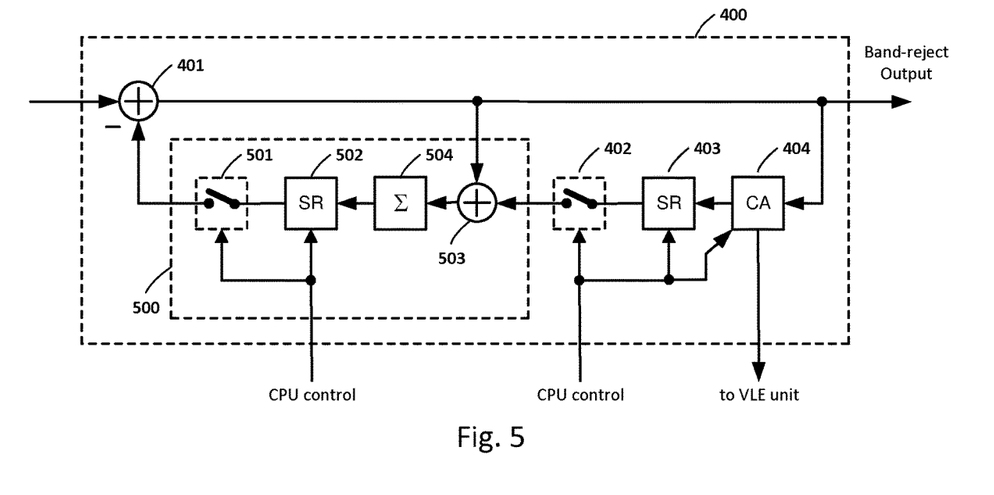
FIG. 5 is a block diagram of the HLPF module with an additional low-pass filter (ALPF).

FIG. 5 shows a block diagram for the high and low pass filtering (HLPF) module including the additional low-pass filtering (ALPF) module that is added into both HLPF modules in order to improve selectivity in the BR mode. The ALPF module is located between the output of switch and the second input of the subtractor of the HLPF module; the ALPF includes:

a) a CPU controlled switch (501), that is open in the SA mode and closed in the BR mode;

b) an adjustable shift register (502), whose output is connected to second input of the subtractor (401) via the switch (501);

c) an adder (503), the first input of which is connected to the output of the switch (402), and the second input of the adder (503) is connected to the output of the subtractor (401);

d) a cumulative adder (504), whose input is connected to the adder (503) output and output is connected to input of the shift register (502).

Figure 6:
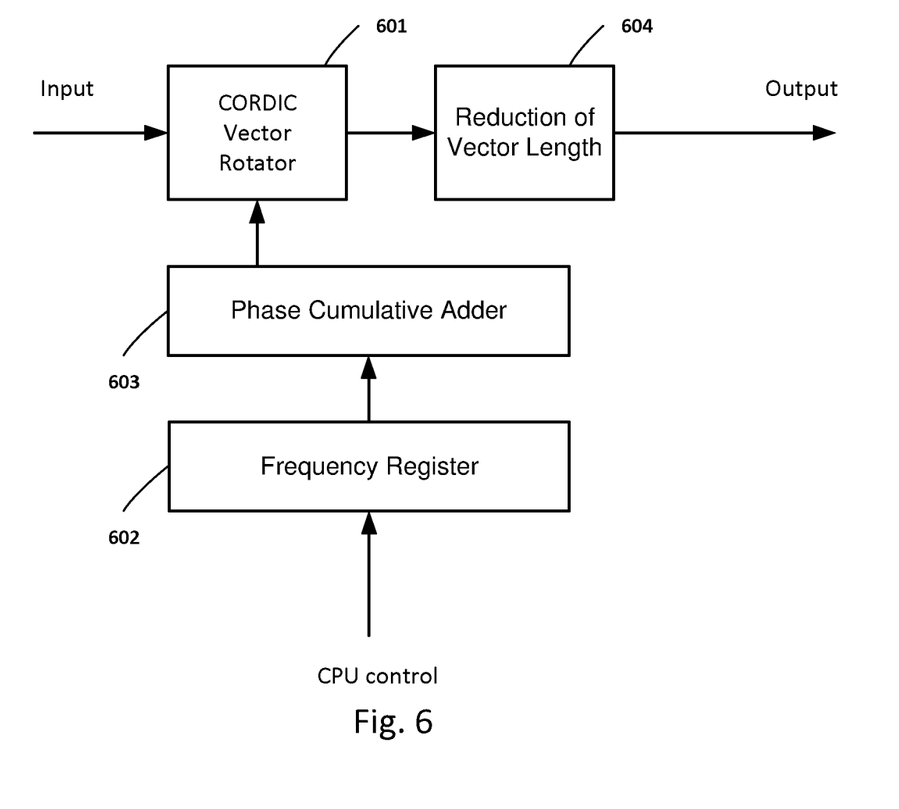
FIG. 6 is a block diagram of a module of up/down frequency conversion (FC).

FIG. 6 shows a block diagram of a module of up/down frequency conversion (FC) that includes:

a) a CORDIC vector rotator (CVR) (601) that rotates an input vector in a plane, based on a shift-add structure CORDIC algorithm for integers (see Volder, "The CORDIC Trigonometric Computing Technique");

b) a frequency register (FR) (602) storing number of reference frequency set by the CPU;

c) a phase cumulative adder (PCA) (603), that accumulates, at a sampling frequency $f_s$, the reference frequency number stored in the FR; an output of the PCA is provided to the CVR reference;

d) a block (604) for reduction of vector length (RVL) by reducing the magnitude of its orthogonal components.

The FC module is controlled by the CPU and executes up/down frequency conversion of the spectrum of the input signal.

Figure 7A:
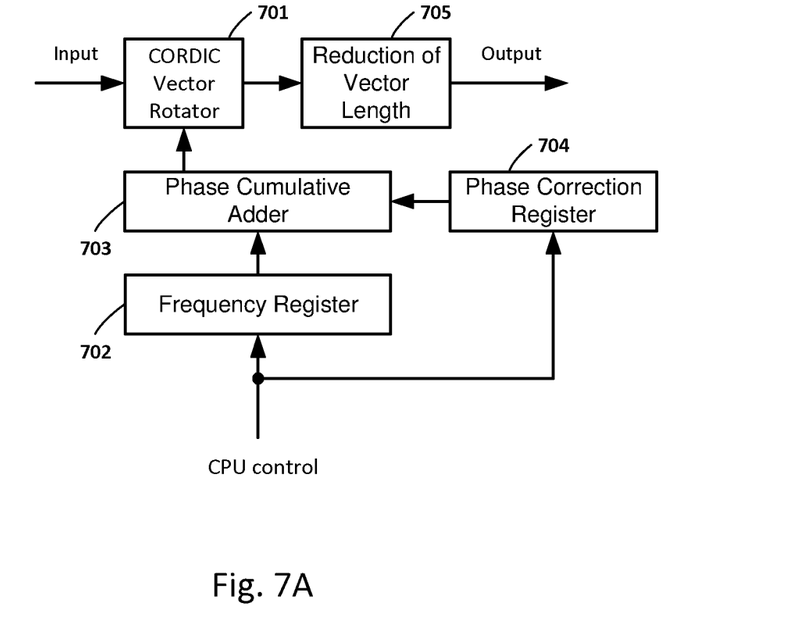
FIG. 7A is a block diagram of a module of up/down frequency conversion with phase correction (FCPC).
Figure 7B:
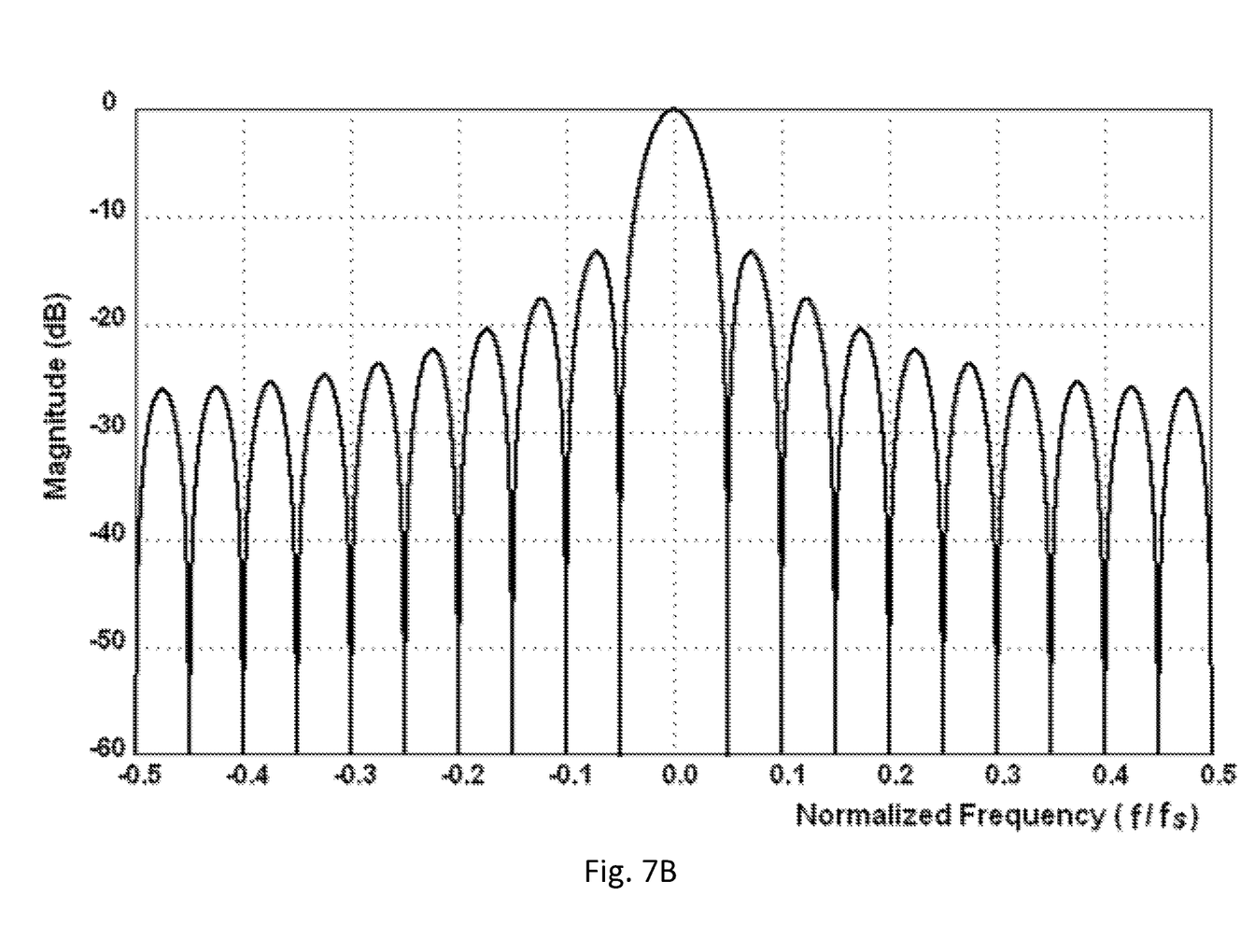
FIG. 7B shows the normalized frequency response of the cumulative adder with reset (CAWR).

FIG. 7A shows a block diagram of a module of up/down frequency conversion with phase correction (FCPC) that differs from the FC module (FIG. 6) by the presence of an additional phase correction register (PCR) 704, storing a phase correction number, that is added to the phase cumulative adder (PCA) and then reset to zero. Other components of this module include (a) a CORDIC vector rotator (CVR) (701), (b) a frequency register (FR) (702) storing number of reference frequency set by the CPU; (c) a phase cumulative adder (PCA) (703), that accumulates, at a sampling frequency $f_s$, and (d) a block (705) for reduction of vector length (RVL) are similar to FIG. 6. (It is necessary for compensating of the phase shift of the useful signal, which may occur when implementing this device due to time delays in the circuit elements.

FIG. 7B shows the normalized frequency response of the cumulative adder with reset (CAWR), (see equation (1) above), that is proposed to use as a low-pass filter; at a sampling rate $f_s$=1 MHz and M=20, the width of the main lobe of the filter is equal to 50 KHz.

FIG. 8 shows the normalized frequency response of a zero-centered notch filter, whose output is the output of the subtractor (401), see FIG. 4, that is his normalized frequency response $S_{HP}(x, M)$ equals: $S_{HP}(x, M) = 1 - 1/M^* a\ \text{sin}\ c(x, M)$; at a sampling rate $f_s$=1 MHz and M=20, the filter notch bandwidth is about 50 kHz.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A digital reconfigurable anti-jam (AJ) apparatus for spectrum analysis and narrow-band interference suppression, the AJ apparatus comprising:

a) a central processing unit (CPU);

b) N dual mode modules (N>2) for spectrum analysis and band rejection (SABR), each SABR module receiving a digital quadrature signal input, outputting a spectral data output to the CPU through an interface, and then outputting a quadrature output with interference band rejected, wherein the CPU controls the SABR modules parameters and operation mode to first place the SABR modules into a spectral analysis (SA) mode, and upon detection of interference, then to place at least one of the SABR modules into a band rejection (BR) mode for as long as the interference continues;

c) N N-to-1 multiplexers, whose quadrature outputs are connected to quadrature signal inputs of the corresponding SABR modules, wherein the multiplexers have a control input from the CPU, wherein the control input controls whether to connect an input of each multiplexer either to the digital quadrature signal input or to a quadrature band-reject output of any other SABR module;

d) a (N+1)-to-1 multiplexer controlled by the CPU, through which it can be connected to a quadrature signal input or to a quadrature output of any SABR module;

e) a frequency conversion (FC) module, that receives as input a quadrature output of the (N+1)-to-1 multiplexer and whose output is a filtered quadrature output of the AJ apparatus, wherein the FC module is controlled by the CPU and executes up/down frequency conversion of a spectrum of the digital quadrature signal input.

2. The apparatus of claim 1, wherein the FC module comprises:
   a) a CORDIC vector rotator (CVR) that rotates an input vector in a plane, based on a shift-add structure CORDIC algorithm for integers;
   b) a frequency register (FR) storing a number of reference frequency set by the CPU;
   c) a phase cumulative adder (PCA), that accumulates at a sampling frequency $f_s$ the reference frequency number stored in the FR, wherein an output of the PCA is provided to a CVR reference input; and
   d) a block of reduction of vector length (RVL) of a vector at input of the CORDIC by reducing a magnitude of its orthogonal components.

3. The apparatus of claim 1, wherein each SABR module comprises a frequency conversion with frequency step (FCFS) module, a filtering of orthogonal components (FOC) module, vector length estimation (VLE) module, and spectral data processing (SDP), all connected in sequence, wherein
   a) a quadrature input of the FCFS module is the SABR module input,
   wherein a reference frequency of the FCFS module is constant in the band rejection (BR) mode and set by the CPU, and
   wherein, in the spectral analysis (SA) mode, reference frequencies are tuned by the CPU;
   b) in the BR mode the FOC module performs high-pass filtering with an adjustable bandwidth based on the CPU control and outputs the quadrature output with interference band rejected; and
   in the SA mode the FOC module performs low-pass filtering with an adjustable bandwidth by the CPU control and outputs spectral samples corresponding to the reference frequencies of the FCFS;
   c) the VLE module estimates a vector length representing components of the quadrature signal input using a magnitude of the components of the quadrature signal input, wherein the vector length represents a spectral estimate corresponding to a current reference frequency of the FCFS;
   the SPD unit stores the vector length at the corresponding reference frequency and makes the vector length and the reference frequency available to the CPU.

4. The apparatus of claim 2, wherein the CPU controls a range of frequencies, a frequency step, and a number of samples at a particular frequency.

5. The apparatus of claim 3, wherein the FCFS module comprises:
   e) a CORDIC vector rotator (CVR) that rotates an input vector in a plane, based on a shift-add structure CORDIC algorithm for integers;
   f) a frequency step (FS) register storing a step number of reference frequency change;
   g) a frequency cumulative adder (FCA), that accumulates with frequency $f_{FCA}=f_s/N_{FCA}$ the frequency step number, where $f_s$ is a sampling frequency, $N_{FCA}>1$ is an integer set by the CPU;
   h) a phase cumulative adder (PCA), that accumulates at a sampling frequency $f_s$ a reference frequency number stored in the FCA, wherein an output of the PCA is provided to a CVR reference input; and
   i) a block of reduction of vector length (RVL) of a vector at input of the CORDIC by reducing a magnitude of its orthogonal components.

6. The apparatus of claim 3, wherein the FOC module includes two identical dual mode high and low pass filtering (HLPF) modules of orthogonal components of an input of the FOC module, wherein each HLPF module includes:
   a) a subtractor, whose first input is connected to an input of the HLPF module and an output of the subtractor is connected to an output of the HLPF module,
   b) a CPU controlled switch that is open in the SA mode and closed in the BR mode,
   c) an adjustable shift register, whose output is connected to second input of the subtractor,
   d) a cumulative adder, whose input is connected to the subtractor output and output is connected to input of the shift register via the switch.

7. The apparatus of claim 6, wherein each HLPF module includes an additional low-pass filter (ALPF) located between an output of the switch and a second input of the subtractor of the HLPF module, the ALPF module including: a) a second CPU-controlled switch, that is open in the SA mode and closed in the BR mode; b) a second adder, whose first input is connected to the output of the adjustable shift register of the HLPF module and whose second input of the second adder is connected to the output of the subtractor of the HLPF module; c) a second CPU-adjustable shift register, whose output is connected to a second input of the subtractor of the HLPF module; and d) a second cumulative adder whose output is connected to input of the second CPU-adjustable shift register via the switch.

8. The apparatus of claim 2, wherein the FC module also includes a phase correction register (PCR), which is written into by the CPU and its contents is added to the phase cumulative adder (PCA) to compensate for a phase shift of the quadrature signal input.

9. A digital anti-jam (AJ) apparatus, the AJ apparatus comprising:
   a) a central processing unit (CPU);
   b) N spectrum analysis and band rejection (SABR) modules (N>2), each SABR module receiving a digital quadrature signal input, outputting a spectral data output to the CPU, and also outputting a quadrature output with interference band rejected,
   wherein the CPU controls the SABR modules to first place the SABR modules into a spectral analysis (SA) mode, and upon detection of interference, then to place at least one of the SABR modules into a band rejection (BR) mode while the interference continues;
   c) N N-to-1 multiplexers, whose quadrature outputs are connected to the quadrature signal inputs of the corresponding SABR modules,
   wherein the CPU controls whether to connect an input of each multiplexer either to a quadrature signal input or to a quadrature band-reject output of any other SABR module;
   d) a (N+1)-to-1 multiplexer controlled by the CPU, through which it can be connected to a quadrature signal input or to a quadrature output of any SABR module; and
   e) a frequency conversion (FC) module, that receives a quadrature output of the (N+1)-to-1 multiplexer and whose output is a filtered output of the AJ apparatus,
   wherein the FC module shifts a spectrum of the digital quadrature signal input up or down.

10. The apparatus of claim 9, wherein the FC module comprises:
a) a CORDIC vector rotator (CVR) that rotates an input vector in a plane, based on a shift-add structure CORDIC algorithm for integers;
b) a frequency register (FR) storing a number of reference frequency set by the CPU;
c) a phase cumulative adder (PCA), that accumulates at a sampling frequency $f_s$ a reference frequency number stored in the FR, wherein an output of the PCA is provided to the CVR reference input; and
d) a block of reduction of vector length (RVL) of a vector at an input of the CORDIC by reducing a magnitude of its orthogonal components.

11. The apparatus of claim 9, wherein each SABR module comprises a frequency conversion with frequency step (FCFS) module, a filtering of orthogonal components (FOC) module, vector length estimation (VLE) module, and spectral data processing (SDP), all connected in sequence, wherein
a) a quadrature input of the FCFS module is the SABR module input,
wherein a reference frequency of the FCFS module is constant in the band rejection (BR) mode and set by the CPU, and
wherein, in the spectral analysis (SA) mode, reference frequencies are tuned by the CPU;
b) in the BR mode, the FOC module performs high-pass filtering with an adjustable bandwidth and outputs a quadrature output with interference band rejected; and
in the SA mode the FOC module performs low-pass filtering with an adjustable bandwidth and outputs spectral samples corresponding to the reference frequencies of the FCFS;
c) the VLE module estimates a vector length representing components of the quadrature signal input using a magnitude of components of the quadrature signal input, wherein the vector length represents a spectral estimate corresponding to a current reference frequency of the FCFS;
the SPD unit stores the vector length at a corresponding reference frequency and makes the vector length and the reference frequency available to the CPU.

12. The apparatus of claim 11, wherein the CPU controls a range of frequencies, a frequency step, and a number of samples at a particular frequency.

13. The apparatus of claim 11, wherein the FCFS module comprises:
a) a CORDIC vector rotator (CVR) that rotates an input vector in a plane, based on a shift-add structure CORDIC algorithm for integers;
b) a frequency step (FS) register storing a step number of reference frequency change;
c) a frequency cumulative adder (FCA), that accumulates with frequency $f_{FCA}=f_s/N_{FCA}$ the frequency step number, where $f_s$ is a sampling frequency, $N_{FCA} \geq 1$ is an integer set by the CPU;
d) a phase cumulative adder (PCA), that accumulates at a sampling frequency $f_s$ a reference frequency number stored in the FCA, wherein an output of the PCA is provided to a CVR reference input; and
e) a block of reduction of vector length (RVL) of a vector at input of the CORDIC by reducing a magnitude of its orthogonal components.

14. The apparatus of claim 11, wherein the FOC module includes two identical dual mode high and low pass filtering (HLPF) module of orthogonal components of an input of the FOC module, wherein each HLPF module includes:
a) a subtractor, whose first input is connected to an input of the HLPF module and output of the subtractor is connected to an output of the HLPF module,
b) a CPU controlled switch that is open in the SA mode and closed in the BR mode,
c) an adjustable shift register, whose output is connected to second input of the subtractor,
d) a cumulative adder, whose input is connected to the subtractor output and output is connected to input of the shift register via the switch.

15. The apparatus of claim 14, wherein each HLPF module includes an additional low-pass filter (ALPF) located between an output of the switch and a second input of the subtractor of the HLPF module, the ALPF module including: a) a second CPU-controlled switch, that is open in the SA mode and closed in the BR mode; b) an adder, whose first input is connected to the output of the shift register of the HLPF module and whose second input of the adder is connected to the output of the subtractor of the HLPF module; c) a second CPU-adjustable shift register, whose output is connected to the second input of the subtractor of the HLPF module; and d) a cumulative adder whose output is connected to input of the second CPU-adjustable shift register via the second CPU-controlled switch.

* * * * *